United States Patent [19]
Henry

[11] Patent Number: 5,724,298
[45] Date of Patent: Mar. 3, 1998

[54] LOW LEAKAGE DATA RETENTION POWER SUPPLY CIRCUIT

[75] Inventor: Paul Dishaun Henry, Carmel, Ind.

[73] Assignee: Thomson Consumer Electronics, Inc., Indianapolis, Ind.

[21] Appl. No.: 823,266

[22] Filed: Mar. 24, 1997

Related U.S. Application Data

[63] Continuation of Ser. No. 739,777, Oct. 30, 1996, abandoned.
[51] Int. Cl.$^6$ ........................................... G11C 7/00
[52] U.S. Cl. ........................ 365/229; 365/228; 365/226
[58] Field of Search ................................ 365/229, 226, 365/228, 175

[56] References Cited

U.S. PATENT DOCUMENTS 5,058,075  10/1991  Mizuta ............................. 365/229
5,568,441  10/1996  Sanemitsu ........................ 365/229

OTHER PUBLICATIONS

"Battery Back–Up Power Supply", IBM Technical Disclosure Bulletin, vol. 23, No. 3, Aug. 1980, pp. 1240–1241.
Paul Horowitz and Winfield Hill, *The Art of Electronics*, Copyright © Cambridge University Press 1980, England, Reprinted 1983 in USA, p. 213.
TL431C, TL431AC, TL431I, TL431AI, TL431M, TL431Y Adjustable Precision Shunt Regulators, Copy © 1996, Texas Instruments Incorporated, pp. 8–18.

*Primary Examiner*—David C. Nelms
*Assistant Examiner*—Huan Hoang
*Attorney, Agent, or Firm*—Joseph S. Tripoli; Joseph J. Laks; Marion P. Metelski

[57] ABSTRACT

A data storage device requires a nominal input supply voltage, within a range having upper and lower tolerance limits in which stored data is retained. A capacitor is coupled to the data storage device. A supply voltage has a voltage greater than at least the upper tolerance limit. A regulator energized by the power supply provides a regulated voltage to the data storage device and the capacitor, the regulator presenting a low leakage discharge path for the capacitor. A feedback circuit is coupled to the regulated voltage and the regulator, the regulated voltage being held, preferably precisely held, at a voltage level between the nominal input supply voltage and the upper tolerance limit. The capacitor energizes the data storage device following an interruption of power from the power supply, discharging very slowly through the low leakage discharge path. The stored data is retained for an extended period of time.

17 Claims, 2 Drawing Sheets

LOW LEAKAGE DATA RETENTION POWER SUPPLY CIRCUIT

This is a continuation of application Ser. No. 08/739,777, filed Oct. 30, 1996, now abandoned.

BACKGROUND OF THE INVENTION

1. Field of the Invention

The invention relates generally to the field of preventing data loss in volatile memory devices during temporary power interruptions. In this field, the invention relates more particularly to low cost active arrangements for preventing such data loss in volatile memory devices which are far more reliable and effective than higher cost active arrangements known in the art.

2. Description of Related Art

Electronic equipment such as televisions, video cassette recorders, set-top cable or satellite interface units and the like often have a standby mode in which only a limited number of loads are powered. A low power dissipation standby power supply can be operative whenever the equipment is coupled to the domestic mains, for maintaining a supply voltage to one or more random access memories (RAM's) that store information such as operational selections (e.g., present channel number, last channel number, selected volume level), the current date and the like, and for powering other loads such as an infrared receiver waiting for a user command to turn on.

The standby power supply provides power to retain the data stored in registers, while the apparatus is turned off but still plugged-in to the domestic AC mains. However, the possibility s remains that power could be interrupted on the domestic mains. This can occur inadvertently by operation of a circuit breaker due to a power distribution fault or lightning storm, or deliberately by the user unplugging the apparatus temporarily from a powered wall receptacle.

For some types of equipment, the loss of stored information due to a power failure can be a major inconvenience. Set-top boxes such as cable or satellite interface equipment may store channel and tuning information, requiring automatic tuning and channel selection operations to restore operation if the data is lost. In the case of the Starsight® system, for example, a great deal of program identification and scheduling information, news, stock quotes and similar data is downloaded to an interface circuit and stored in random access memory. This information is transmitted cyclically in an ongoing manner over a relatively low-bandwidth signaling path, during the vertical blanking period of video broadcasts. If the stored information is lost due to a temporary power failure, several hours may elapse before the transmitted information progresses through a full cycle, permitting the interface circuit to download a complete set of information. Such equipment advantageously includes means to power volatile memories for a time after a power interruption, to retain the information previously stored. Another example is a personal computer, in which setup information is stored in volatile memory.

Most instances of power interruption on the domestic mains are relatively brief. In passive arrangements, it is known to use batteries as emergency power sources for data storage devices. In active arrangements, it is known to provide charge storage elements such as capacitors to provide power to a data memory for retaining stored data during a temporary loss of power. The capacitor, and sometimes the battery, is charged when power is available on the mains, and is coupled by a diode to the power input of the memory, for retaining the data during the power outage. A battery is advantageous in that it can power the memory for a relatively long time, and the voltage supplied by the battery remains near its nominal voltage until the battery is nearly completely discharged. However, batteries tend to be quite expensive, and even rechargeable batteries wear out over a number of cycles of charging and discharging, and must be replaced. Such replacement requires that the device be opened, which is disadvantageous in a consumer electronics product.

A capacitor normally can be charged and discharged indefinitely without requiring replacement. Although a battery remains near its nominal voltage until discharged, a capacitor discharges according to the RC time constant of the capacitor and the associated load, for example a memory storage device and the power supply which energizes the device and which charges the capacitor. A large capacitor can be provided to supply a voltage to power a data memory for a time, but the voltage supplied by the capacitor fails exponentially during that time. Thus, even though the capacitor may discharge for a long period of time, the capacitor may only provide sufficient voltage to maintain the contents of the memory for a short period of time after the capacitor begins to discharge.

The data in a memory device may become corrupted or may be lost if the power supply voltage drops below a low limit supply voltage tolerance according to the design specifications of the device. A typical 5 V memory device such as a CMOS or TTL RAM may be specified as operable within power supply limits of 5 V±0.5 V, such that the supply voltage can vary within 10% of the nominal voltage and the memory will still operate. If a power supply produces a nominal 5.0 V exactly, and this voltage is used to charge a storage capacitor, then after a power interruption occurs the stored data can be corrupted or lost if the storage capacitor discharges only to 4.5 V or by 10% of its charge, before power is restored.

Power supplies also have design tolerances. For example, if the power supply is rated at 5 V ±5%, the charging voltage applied to the capacitor could be as little as 4.75 V. In that case, assuming the foregoing design specifications of the RAM, the stored data will be invalid when the capacitor discharges by merely 0.25 V, providing minimal time in which data is retained after a power interruption. In the case of a power supply rated at 5 V±10%, it is possible that there will be no data retention time at all, namely because some power supplies within this tolerance will supply only 4.5 V, the minimum permitted.

A known technique for using a storage capacitor to power a memory for data retention, is to provide a DC-DC converter and regulator. The voltage across the storage capacitor is coupled to the input of the DC-DC converter, which regulates its output to the nominal 5 V for powering the RAM following a power interruption. The DC-DC converter can handle a range of input voltages while maintaining a nominal output voltage so long as there is sufficient charge on the capacitor to operate the DC-DC converter. For example, the DC-DC converter may continue to supply 5 V on the output until the voltage on its input drops to about 1 V. The DC-DC converter improves data retention time as compared to a capacitor alone, by keeping the power input to the memory circuit above the low tolerance limit of supply voltage at which data can become corrupted or lost. Integrated circuit DC-DC converters are available for this purpose but are quite expensive. A DC-DC converter also may produce undesirable radio frequency interference, and introduce problems related to startup and stability.

SUMMARY OF THE INVENTION

According to the inventive arrangement, a DC-DC converter is not required. According to one aspect of the inventive arrangement, a voltage regulator is provided for charging a memory retention storage capacitor to a supply voltage higher than the nominal supply voltage of the memory device, preferably approaching the upper tolerance limit of the memory device. In this manner, the storage capacitor has farther to discharge to reach the low tolerance limit at which the stored data becomes invalid.

According to another aspect of the inventive arrangement, the regulator comprises a high precision series regulator using a programmable reference that has low leakage to ground. The regulator is coupled to a voltage higher than the nominal supply voltage for the memory, and produces a regulated output voltage set near the high end of the nominal range of power supply voltage, for example 5.3 V for a nominal 5 V memory. This is possible notwithstanding typical variations in component values without exceeding the high limit of nominal power supply range, due to the precise nature of the supply.

The high starting voltage on the storage capacitor and the low leakage precision regulator enable the storage capacitor to discharge for a substantial period of time before reaching the lower limit of s nominal supply voltage to the memory. Thus, data is retained at minimum expense and with minimal complication, achieving retention times of 15 minutes to an hour with a storage capacitor of a reasonable size and nominal expense, particularly as compared to a DC-DC converter.

A data storage arrangement, in accordance with inventive arrangements taught herein, comprises: a data storage device requiring a nominal input supply voltage level, within a range having upper and lower tolerance limits within which stored data is retained; a capacitor coupled to the data storage device; a source generating an s output supply voltage at a voltage level greater than at least the upper tolerance limit; a regulator energized by the source and supplying a regulated voltage to the data storage device and to the capacitor, the regulator presenting a low leakage discharge path for the capacitor; a feedback circuit coupled to the regulated voltage and to the regulator, the regulated voltage being held at a certain voltage level between the nominal input supply voltage and the upper tolerance limit; and, the capacitor energizing the data storage device to retain the stored data for an extended period of time following an interruption of power from the power supply, during which the capacitor slowly discharges to a voltage level below the lower tolerance limit.

The regulator, for example, comprises: a blocking diode for coupling the regulated voltage to the data storage device and to the capacitor; and, a precision reference circuit functionally equivalent to a Zener diode having a controllable breakdown voltage, the breakdown voltage being controlled responsive to a signal from the feedback circuit. The regulator maintains the regulated voltage nearly equal to the upper tolerance limit, for example, at a level less than the upper tolerance limit by not more than approximately ten percent of the tolerance range.

The data storage device is, for example, a digital RAM. The feedback circuit comprises, for example, a voltage divider coupled to the precision circuit.

In a first embodiment, the feedback circuit is coupled to a common junction of the diode, the capacitor and the data storage device, enhancing regulation precision.

In a second embodiment, the diode is coupled between the feedback circuit and a common junction of the capacitor and the data storage device, enhancing leakage resistance through the regulator.

DETAILED DESCRIPTION OF THE PREFERRED EMBODIMENTS

Figure 1:
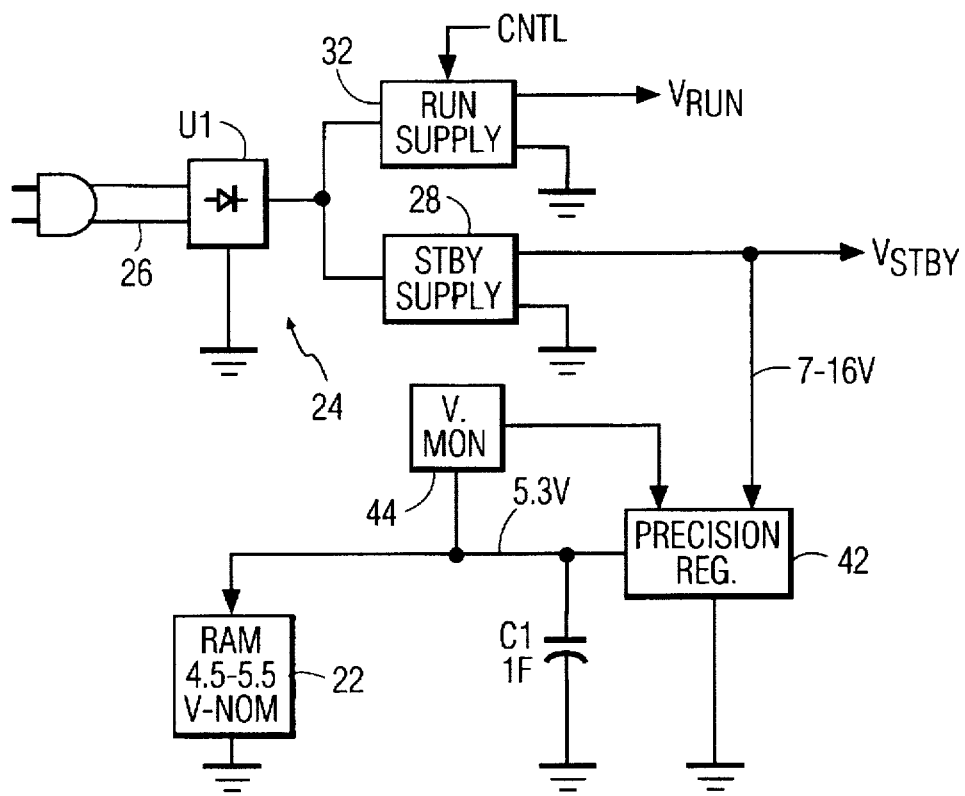
FIG. 1 is a block diagram of an inventive arrangement.

Referring to FIG. 1, the inventive circuit extends the time of operation of a data storage device such as a digital random access memory, or RAM, 22, following interruption of electric power from a power source 24, in order to retain the contents of the memory over a brief power failure. The voltage source in the example shown is a voltage developed from the AC mains 26 using a rectifier U1 and a standby power supply 28. In any event, power source 24, including for example standby supply 28, makes an output voltage VSTBY available whenever there is power at mains 26. The unit may also include one or more other supplies 32 that are activated only in response to a control signal (CNTL), termed a run supply.

The data storage device or RAM 22 is specified for a nominal supply voltage, subject to upper and lower tolerance limits within which device 22 will still operate to store and retain data, etc. Assuming, for example, that device 22 is rated for a nominal supply voltage of 5.0 V and a 10% tolerance, the power supply voltage can be between 4.5 and 5.5 V. When powered at a voltage outside the applicable tolerance span, the data stored in device 22 may become corrupt or may be lost.

If power is interrupted at the power source, for example due to a circuit breaker coupled to mains 26, the power supply voltage would normally fall off, causing the supply voltage coupled to device 22 to drop below the minimum necessary to retain data, and ultimately to fall to zero. A storage capacitor C1, however, is, charged to a charging voltage when power is present at source 24. Then if the power fails, capacitor C1 discharges through the resistance of RAM 22. The RC time constant of capacitor C1 and the resistance of RAM 22 are such that the RAM 22 will retain its contents from the moment of power failure until the voltage across capacitor C1 drops from its charging value to below the lower tolerance limit (e.g., 4.5 V). If this time exceeds the duration of the power failure, the data in RAM 22 remains valid when power is restored.

However, if the power supply voltage (and thus the charging voltage) are relatively low, the time of data retention will be short. According to an inventive aspect, storage capacitor C1 is charged to a voltage near the upper tolerance limit of RAM 22 (e.g., 5.5 V) by a regulator 42 coupled to the source 24 of electric power. In the example shown, regulator 42 has an input voltage VSTBY of 7–16 V, and maintains the charging voltage on capacitor C1 when power is present at the source.

The time of discharge of capacitor C1 from the charging voltage to the lower tolerance limit is longer when the starting voltage is higher, shorter when the starting voltage is lower, and would be zero if the starting voltage was equal to the lower tolerance limit. By starting at a voltage that is high in the tolerance range, the data retention time is increased. As a manufacturing matter, however, the tolerance ranges are established to account for normal variations in component values. If one simply attempts to regulate in a conventional manner but to a higher voltage, a certain number of units will in fact regulate to a voltage in excess of the upper tolerance limit. According to a further inventive aspect, this difficulty is solved by using a precision regulator 42, preferably coupled to the charging voltage by a voltage monitor 44 providing feedback to regulator 42 for accurate control. In this manner the charging voltage is accurately set close to the upper tolerance limit.

Figure 2:
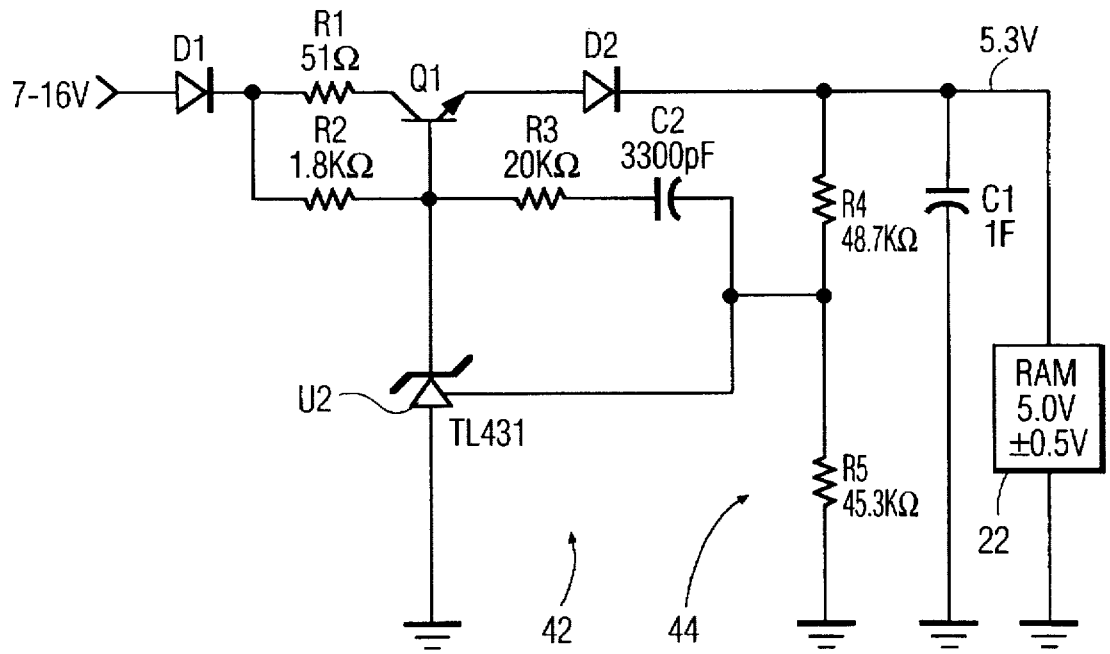
FIG. 2 is a schematic diagram showing a first embodiment of the inventive arrangement.

A first embodiment of the inventive arrangement is shown schematically in FIG. 2, with the source and $V_{STBY}$ regulator not shown for purposes of clarity. The same reference numbers are used throughout the drawings to refer to the same elements. Regulator 42 comprises a series regulator transistor Q1, the base of which is coupled to a precision reference device U2, for example the Motorola TL431 programmable precision reference, having a control input sensitive to the regulated output voltage, and an internal voltage reference.

Precision regulators are understood by those skilled in the art to be exemplified, for example, by the Motorola® Programmable Precision References of the TL431, A, B Series. Such precision regulators provide precise regulation, as the terms precision and precise are used herein. The voltage reference tolerance of the TL431AC, for example, is ±1%. If each of the feedback resistors R4 and R5 has a tolerance of ±0.5%, the combined tolerance of the resistors is ±1%. The sum of the tolerances of the precision regulator and the feedback resistors, namely ±1% plus ±1%, results in an overall power supply tolerance of ±2%. The invention will work with smaller tolerances, of course, and may work with larger tolerances, depending on other circuit parameters.

Transistor Q1 is biased by resistors R1 and R2 in series with the s collector and coupled to the base, respectively. Input diode D1 in series with the collector, blocks current in a reverse direction toward the 7–16 V supply input, such that this path is blocked for discharge of capacitor C1 through the control and biasing components when the 7–16 V supply falls to zero.

The emitter-base junction of transistor Q1 is normally reverse biased during power loss. Diode D2 is used primarily to protect the emitter-base junction of the transistor Q1 from reverse breakdown voltage, for example, by blocking reverse current through the transistor.

Reference device U2, which acts like a Zener diode with a controllable breakdown voltage, also blocks current such that the series regulator circuit is low in current leakage. The discharge time of storage capacitor C1 is substantially defined by the RC time constant of capacitor C1 and the resistances of RAM 22 in parallel with voltage divider resistors R4, R5. The voltage divider of R4, R5 feeds back a signal representing the charging voltage on capacitor C1, providing a voltage monitor. Resistor R3 in series with capacitor C2 provides negative feedback to guarantee regulator stability.

The inventive arrangement is described herein with reference to supply voltages and specifications for high and low supply voltage tolerances, using the example of a CMOS or TTL RAM as might be provided in a television receiver or a set-top or cable interface unit. Such RAM's typically are specified for nominal supply voltage connections at +5 V and ground, and are operable within a 10% tolerance of the nominal supply voltage, namely 4.5 to 5.5 V. The upper tolerance limit thus is 1.1 times the nominal voltage and the lower tolerance limit is 0.9 times nominal. The invention is also applicable to other supply voltages and tolerances.

In the embodiment shown, the charging voltage is set at 5.3V or 1.06 times the nominal supply voltage of 5.0 V. Thus, capacitor C1 is charged to near the upper limit of the supply voltage tolerance of RAM 22. These values and proportions reflect a ±10% tolerance. For a broader or narrower tolerance range, the charging voltage can be set to a higher or lower proportion of nominal, as necessary to adhere to the maximum tolerance limit.

Figure 3:
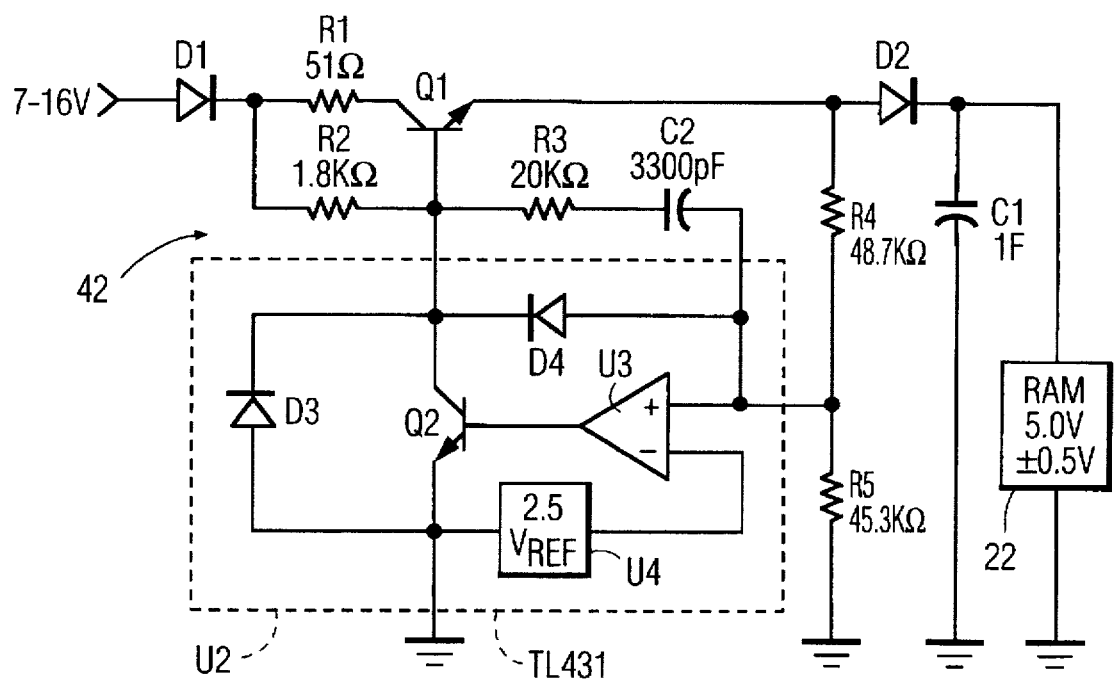
FIG. 3 is a schematic diagram showing a second embodiment of an inventive arrangement and including a functional representation of a programmable precision regulator.

The voltage divider of resistors R4, R5 in FIG. 2 senses the s voltage directly across storage capacitor C1 and across RAM 22. Thus, the precision series regulator directly controls the ultimate voltage of interest such that the charging voltage on capacitor C1 can be accurately set as high as safely possible. This represents a tradeoff as to the retention time possible because capacitor C1 can discharge through resistors R4, R5 during a power failure. Referring to the embodiment shown in FIG. 3, it is also possible to place blocking diode D2 between the storage capacitor and the voltage monitoring circuit of resistors R4, R5 to block this discharge path. The consequence of the arrangement of FIG. 3 is that the voltage drop s across diode D2 is somewhat dependent on current loading. As a result, the precision regulator does not control the voltage on capacitor C1 and RAM 22 as accurately as in the embodiment shown in FIG. 2, and accordingly, the charging voltage cannot be set as close to the upper tolerance limit (e.g., 5.5 V) due the uncertainty about the voltage drop across diode D2.

In FIG. 2, the initial current drain on capacitor C1 when discharging, namely through the parallel resistances of RAM 22 and voltage divider R4, R5, is about 200 micro amps when the voltage on capacitor C1 is at 5.25 V. The current discharge drops proportionately s with the voltage. Assuming a 1.0 farad capacitance for storage capacitor C1, the embodiment of FIG. 2 supplies sufficient current to keep the voltage on RAM 22 above 4.5 V for slightly more than one hour, which is adequate in most instances of temporary power failure. A capacitance of 0.22 farads with the resistances shown will allow data retention for about 15 minutes.

The resistances of voltage divider resistors R4, R5 can be increased to reduce leakage. However, variations in the input leakage current of the U2 reference pin will begin to affect the accuracy of the voltage fed back by resistors R4 and R5.

FIG. 3 illustrates the internal workings of the precision voltage reference circuit U2 of precision regulator 42, also shown functionally in FIG. 2 as a controllable Zener diode. Circuit U2 comprises a differential amplifier U3 with one input coupled to a precision 2.5 V reference U4 and a second input coupled to the voltage monitoring resistors R4, R5. The values of resistors R4, R5 are chosen to provide 2.5 V to the second input when the regulated voltage (the emitter of transistor Q1 in FIG. 3) is at the required voltage level for obtaining the desired charging voltage near the upper tolerance limit of RAM 22. Amplifier U3 drives a transistor Q2, the conduction of which resembles the reverse conduction of a Zener diode at its breakdown voltage, and diodes D3 and D4 clamp the collector of transistor Q2 relative to ground and relative to the input sensed voltage from resistors R4, R5. Thus the precision reference U2 functions like a Zener diode having a breakdown voltage that is determined or programmed by voltage divider D4, D5.

The output voltage applied to RAM 22 and storage capacitor C1 is regulated to 1.4 V less than the voltage at the collector of transistor Q2 when conducting, representing the base-emitter voltage of transistor Q1 and the forward diode drop across diode D2. This output voltage is set to just slightly less than the upper tolerance limit for the supply voltage to RAM 22. Preferably, the output voltage is regulated to a few tenths of a volt below an upper tolerance limit of 5.5 V, for example 5.3 V. In accordance with the overall tolerance of the power supply of ±2%, as determined above for the TL431AC and feedback resistors having a tolerance of ±0.5%, a regulated voltage of 5.3 V plus 2% of 5.3 V equals 5.406 V. The resulting sum is, advantageously, only very slightly less than the upper tolerance limit of 5.5 V. Accordingly, if the voltage is regulated to 5.3 V, the voltage supplied to the data storage device will be as high as possible, for all practical purposes, without a risk of exceeding the maximum tolerance of 5.5 V.

Figure 4:
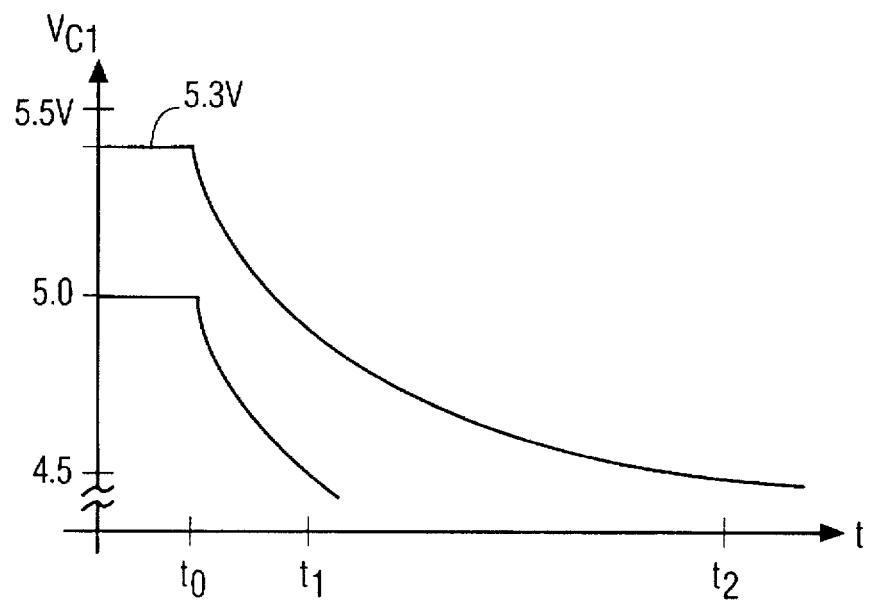
FIG. 4 is a timing diagram useful for understanding the operation the inventive arrangement.

The effect of the inventive circuit on data retention time is shown in FIG. 4. When discharging from nominal 5.0 V after a power failure at time t0, the exponentially falling voltage VC1 on capacitor C1 reaches the lower tolerance limit of 4.5 V at time t1, whereupon the data in RAM 22 is no longer assumed to be valid. If the starting voltage of VC1 is lower, the time would be shorter still. However, by increasing the starting voltage to near the upper tolerance limit of 5.3 V as described above, the data retention time is substantially increased. This is accomplished without the cost and complexity of a DC-DC converter; using instead a precision regulator to maintain the regulated voltage at the upper tolerance limit, or as near to the upper tolerance limit as safety will allow.

What is claimed is:

1. A data storage arrangement, comprising:
   a data storage device requiring a nominal input supply voltage level, within a range having upper and lower tolerance limits, within which range stored data is retained;
   a capacitor coupled to said data storage device;
   a source for generating a power supply voltage at a level greater than at least said upper tolerance limit of said input supply voltage;
   a first diode having a first electrode coupled to said source of power supply voltage for reducing reverse current flow to said source when said power supply voltage exhibits a level less than said upper tolerance limit of said input supply voltage;
   a regulator, coupled to a second electrode of said first diode, for supplying a regulated voltage to said data storage device and to said capacitor; and
   a feedback circuit coupled to said regulator for receiving said regulated voltage, said regulated voltage being held at a certain voltage level between said nominal input supply voltage and said upper tolerance limit;
   said feedback circuit including a second diode for reducing reverse current flow through said regulator when said power supply voltage exhibits a level less than said upper tolerance limit.

2. A voltage regulator for a data storage arrangement including a data storage device requiring a nominal input supply voltage level, within a range having upper and lower tolerance limits, within which range stored data is retained, said regulator comprising:
   a terminal for receiving a power supply voltage at a level greater than at least said upper tolerance limit of said input supply voltage;
   a series arrangement of a first diode, a regulator, and a second diode in the order named; and
   a capacitor coupled to said second diode for storing said input supply voltage for said data storage device;
   said first diode being coupled between said terminal and said regulator for reducing reverse current flow to said terminal when said power supply voltage exhibits a level less than said upper tolerance limit of said input supply voltage;
   said regulator applying a regulated voltage to said second diode;
   said second diode reducing reverse current flow through said regulator when said power supply voltage exhibits a level less than said upper tolerance limit.

3. A data storage arrangement, comprising:
   a data storage device requiring a nominal input supply voltage level, within a range having upper and lower tolerance limits within which stored data is retained;
   a capacitor coupled to said data storage device;
   a source generating an output supply voltage at a voltage level greater than at least said upper tolerance limit;
   a regulator energized by said source and supplying a regulated voltage to said data storage device and to said capacitor, said regulator presenting a low, leakage discharge path for said capacitor;
   a feedback circuit coupled to said regulated voltage and to said regulator, said regulated voltage being held at a certain voltage level between said nominal input supply voltage and said upper tolerance limit; and,
   said capacitor energizing said data storage device to retain said stored data for an extended period of time following an interruption of power from said source, during which said capacitor slowly discharges to a voltage level below said lower tolerance limit.

4. The arrangement of claim 3, wherein said regulator comprises:
   a blocking diode for coupling said regulated voltage to said data storage device and to said capacitor; and,
   a precision reference circuit coupled to said feedback circuit, said precision reference circuit having a current blocking device.

5. The arrangement of claim 3, wherein said regulator comprises a precision reference circuit functionally equivalent to a Zener diode having a controllable breakdown voltage, said breakdown voltage being controlled responsive to a signal from said feedback circuit.

6. The arrangement of claim 3, wherein said regulator maintains said regulated voltage nearly equal to said upper tolerance limit.

7. The arrangement of claim 3, wherein said regulated voltage is less than said upper tolerance limit by not more than approximately ten percent of said tolerance range.

8. The arrangement of claim 3, wherein said feedback circuit comprises a voltage divider coupled to said regulated voltage.

9. The arrangement of claim 3, wherein said regulator comprises a diode for supplying said regulated voltage to said capacitor and to said data storage device.

10. The arrangement of claim 9, wherein said feedback circuit is coupled to a common junction of said diode, said capacitor and said data storage device, enhancing regulation precision.

11. The arrangement of claim 10, wherein said diode is coupled between said feedback circuit and a common junction of said capacitor and said data storage device, enhancing leakage resistance through said regulator.

12. The arrangement of claim 1, wherein said data storage device comprises a digital RAM.

13. A data storage arrangement, comprising:

a data storage device requiring a nominal input supply voltage level, within a range having upper and lower tolerance limits within which stored data is retained;

a capacitor coupled to said data storage device;

a source generating an output supply voltage at a voltage level greater than at least said upper tolerance limit;

a regulator energized by said source, having a blocking diode for coupling a regulated voltage to said data storage device and to said capacitor and having a precision reference circuit functionally equivalent to a Zener diode with a controllable breakdown voltage;

a feedback circuit coupled to said regulated voltage and to said precision reference circuit, said regulated voltage being held precisely at a certain voltage level between said nominal input supply voltage and said upper tolerance limit; and, said capacitor energizing said data storage device following an interruption of power from said source, said certain voltage level being sufficiently high add said regulator presenting a sufficiently low leakage discharge path for said capacitor that said stored data is retained for an extended period of time until said capacitor slowly discharges to a voltage level below said lower tolerance limit.

14. The arrangement of claim 13, wherein said breakdown voltage is controlled responsive to a signal from said feedback circuit.

15. The arrangement of claim 13, wherein said feedback circuit is coupled to a common junction of said blocking diode, said capacitor and said data storage device, enhancing regulation precision.

16. The arrangement of claim 13, wherein said blocking diode is coupled between said feedback circuit and a common junction of said capacitor and said data storage device, enhancing leakage resistance through said regulator.

17. The arrangement of claim 13, wherein said data storage device comprises a digital random access memory.

* * * * *